US007019439B2

(12) United States Patent
DeCastro et al.

(10) Patent No.: US 7,019,439 B2
(45) Date of Patent: Mar. 28, 2006

(54) HIGH POWER ULTRASONIC TRANSDUCER WITH BROADBAND FREQUENCY CHARACTERISTICS AT ALL OVERTONES AND HARMONICS

(75) Inventors: Eugene A. DeCastro, Jamestown, NY (US); Benjamin R. Johnson, Gerry, NY (US); Eugene Phaneuf, Lakewood, NY (US); Timothy W. Piazza, Jamestown, NY (US)

(73) Assignee: Blackstone-Ney Ultrasonics, Inc., Jamestown, NY (US)

( * ) Notice: Subject to any disclaimer, the term of this patent is extended or adjusted under 35 U.S.C. 154(b) by 325 days.

(21) Appl. No.: 10/208,433

(22) Filed: Jul. 30, 2002

(65) Prior Publication Data

US 2003/0220567 A1 Nov. 27, 2003

Related U.S. Application Data

(60) Provisional application No. 60/308,994, filed on Jul. 30, 2001.

(51) Int. Cl.
*H01L 41/00* (2006.01)
*H01L 41/04* (2006.01)

(52) U.S. Cl. ...................... 310/325; 310/334; 310/322; 367/162; 367/163; 367/155; 367/157; 381/114; 381/190

(58) Field of Classification Search ................ 310/325, 310/334, 322; 367/155, 157, 162–163
See application file for complete search history.

(56) References Cited

U.S. PATENT DOCUMENTS

| | | | | |
|---|---|---|---|---|
| 2,895,061 | A | 7/1959 | Probus | 310/311 |
| 3,066,232 | A | 11/1962 | Branson | 310/325 |
| 3,140,859 | A | 7/1964 | Scarpa | 366/114 |
| 3,187,207 | A | 6/1965 | Tomes | 310/325 |
| 3,218,488 | A | 11/1965 | Jacke | 310/325 |
| 3,230,403 | A | 1/1966 | Lewis et al. | 310/334 |

(Continued)

OTHER PUBLICATIONS

International Search Report.

*Primary Examiner*—Darren Schuberg
*Assistant Examiner*—J. Aguirrechea
(74) *Attorney, Agent, or Firm*—Greenberg Traurig, LLP

(57) ABSTRACT

A transducer assembly for receiving a stimulating signal and producing ultrasound therefrom at one or more frequencies, over an ultrabroad bandwidth at each frequency, includes a front mass disposed about a central axis, and a back mass disposed about the central axis, laterally offset from the front mass. The transducer assembly also includes one or more resonators disposed about the central axis and between the front mass and the back mass, including at least one electrical contact for receiving the stimulating signal. The back mass consists of a low-density material, such as aluminum, aluminum alloy, magnesium, or magnesium alloy, or any of various low-density materials known in the art. In general, the back mass is characterized by a density of less than 6.0 g/cc. In one embodiment, the front mass and the back mass are made from different materials, and the front mass includes a deviation from symmetrical symmetry.

25 Claims, 15 Drawing Sheets

SECTION H-H

U.S. PATENT DOCUMENTS

| | | | | | |
|---|---|---|---|---|---|
| 4,363,992 | A | * | 12/1982 | Holze, Jr. | 310/323.19 |
| 4,633,119 | A | * | 12/1986 | Thompson | 310/325 |
| 5,748,566 | A | | 5/1998 | Goodson | 367/158 |
| 5,793,148 | A | * | 8/1998 | R.ang.be | 310/328 |
| 5,998,908 | A | | 12/1999 | Goodson | 310/325 |
| 6,002,195 | A | | 12/1999 | Puskas | 310/325 |
| 6,047,602 | A | * | 4/2000 | Lynnworth | 73/632 |
| 6,181,052 | B1 | * | 1/2001 | Puskas | 310/325 |
| 6,218,768 | B1 | | 4/2001 | Lee et al. | 310/325 |
| 6,288,476 | B1 | | 9/2001 | Puskas | 310/325 |

* cited by examiner

| PART NO | ITEM | QTY | DESCRIPTION | SPECIFICATION |
|---|---|---|---|---|
| 4811439 | 1 | 1 | BACK MASS | ALUMINUM (TYPE 7075-T651 #4970807) |
| 6001556 | 2 | 1 | FRONT MASS | 1 3/4" DIA 2024 AL BAR STOCK |
| 4880366 | 3 | 2 | DISC, CERAMIC | VERNITRON, #P2T-4 |
| 4910217 | 4 | 1 | INSULATOR, SILICONE RUBBER | PHENOLIC TUBING |
| 4811376 | 5 | 2 | ELECTRODE MACHINING | .010 THK NICKEL STRIP |
| 4820435 | 6 | 1 | BIAS BOLT | SCREW: SKHD: 3/8-24 X 1-1/2" |
| 802443 | 7 | 1 | WHITE SILICONE RUBBER TUBING | .0625 ID, .0625 WALL THK, 7" LG |
| 800218 | 8 | 1 | RED SILICONE RUBBER TUBING | .0625 ID, .0625 WALL THK, 7" LG |

| | | | MANUFACTURERS LIST FOR U2 TRANSDUCER | | |
|---|---|---|---|---|---|
| PART | | | | | MANUFACTURER |
| NUMBER | DESCRIPTION OF PART | QTY | | MANUFACTURER | PART NUMBER |
| 6001556 | ALUMINUM FRONT MASS | 1 | | SEPCO-ERIE | 8220 |
| 4811439 | ALUMINUM BACK MASS | 1 | | SEPCO-ERIE | |
| 4820435 | BIAS BOLT 3/8-24 X 1 1/2" | 1 | | ILS | 1110966 |
| 100142 | CYTEC EPOXY DISC 2" HT 424 | 1 | | CYTEC FIBERITE INC. | HT424(RAW MATERIAL) |
| 810723 | ELECTRODE | 2 | | WILLSON MANUFACTURER | |
| 808734 | RED SILICONE WIRE SLEEVING | 1 | | AB ELECTRONICS | |
| 808735 | WHITE SILICONE WIRE SLEEVING | 1 | | AB ELECTRONICS | |
| 4910217 | INSULATOR PHENOLIC TUBING | 1 | | SPAULDING COMPOSITES | T-352 SPAULDITE |
| 800221 | DISC CERAMIC (CRYATALS) 200" | 2 | | MORGAN MATROC INC. | |
| | | | | | |
| | | | | | |
| | | | | | |
| | | | | | |
| | | | | | |
| | | | | | |
| | | | | | |
| | LAPPING PROCESS (BACK MASS) | 1 | | ANTEX | |
| | | | | | |
| | LAPPING PROCESS (FRONT MASS) | 1 | | ANTEX | |
| | | | | | |
| | LAPPING PROCESS (CRYSTALS) | 2 | | MORGAN MATROC | |
| | | | | | |
| TOTAL COST | | | | | |
| (THE PRICE OF THE CRYSTALS, FRONT & BACK MASSES ARE BASED UPON BUYING LOTS OF 1000 AT A TIME) | | | | | |
| (THE PRICE OF HAVING CRYSTALS FRONT & BACK MASSES BEING LAPPED ARE BASED ON LOTS OF 1000 AT A TIME) | | | | | |
| (THERE IS A SMALL IN HOUSE COST OF HAVING THE FRONT MASS SANDBLASTED) | | | | | |

FIG. 10

HIGH POWER ULTRASONIC TRANSDUCER WITH BROADBAND FREQUENCY CHARACTERISTICS AT ALL OVERTONES AND HARMONICS

CROSS-REFERENCE TO RELATED APPLICATIONS

This application is related to the following U.S. application, of common assignee, from which priority is claimed, and the contents of which are incorporated herein in their entirety by reference:

"BROADBAND ULTRASONIC TRANSDUCER WITH MULTIPLE OVERTONES," U.S. Provisional Patent Application Ser. No. 60/308,994.

STATEMENT REGARDING FEDERALLY SPONSORED RESEARCH

Not Applicable

REFERENCE TO MICROFICHE APPENDIX

Not Applicable

BACKGROUND OF THE INVENTION

The present invention relates to ultrasonic systems, and more particularly, to methods of and systems for generating high power ultrasonic sound energy and introducing the ultrasonic sound energy into fluid media for the purpose of cleaning and/or liquid processing For years, ultrasonic energy has been used in manufacturing and processing plants to clean and/or otherwise process objects within liquids. It is well known that objects may be efficiently cleaned by immersion in an aqueous solution and subsequent application of ultrasonic energy to the solution. Prior art ultrasound transducers include resonator components that are typically constructed of materials such as piezoelectrics, ceramics, or magnetostrictives (aluminum and iron alloys or nickel and iron alloys). These resonator components spatially oscillate at the frequency of an applied stimulating signal. The transducers are mechanically coupled to a tank containing a liquid that is formulated to clean or process the object of interest. The amount of liquid is adjusted to partially or completely cover the object in the tank, depending upon the particular application. When the transducers are stimulated to spatially oscillate, they transmit ultrasound into the liquid, and hence to the object. The interaction between the ultrasound-energized liquid and the object create the desired cleaning or processing action.

One type of prior art ultrasound transducer includes one or more resonator components compressed between a front plate and a back plate. In these types of ultrasound transducers, the back plate is typically made from a high-density material such as steel. Although they provide rugged, reliable service, one disadvantage of such high-density back plates is a relatively narrow-band frequency response from the transducer. The prior art resonator components are typically cylindrically symmetrical about a central axis. Although such symmetrical resonators are relatively easy to manufacture because the symmetry lends itself to common fabrication processes. However, symmetrical resonators also tend to produce a relatively narrow-band frequency response.

Prior art resonator components are typically "silvered," i.e., a conductive material such as silver, tin, gold, solder, etc., is applied to one or more surfaces of the resonator component to create an electrical contact. This silvered contacts primary purpose is to provide a uniform electrical charge across the surface of the resonator. After the silvering process, the resonator goes through a "poling" process that aligns the dipoles in the internal structure of the piezoelectric resonator. One disadvantageous side effect of this process is the introduction some small dimensional deformations. A second disadvantage of prior art resonators is the non-uniformity in the thickness of the silver coating itself, caused by the method of silk-screening the silvered coating on, which is inherently non-uniform. Such deformations and non-uniform thickness effect the flatness of the resonator surface and therefore the mechanical coupling and final performance of the transducer stack.

SUMMARY OF THE INVENTION

One embodiment of the invention includes a Langevin type transducer characterized by the ability to operate at one or multiple frequencies, and over an ultrabroad bandwidth at each frequency. As used to herein, the term "ultrabroad bandwidth" refers to a frequency bandwidth that is greater than or equal to ten percent (10%) of the center frequency of the bandwidth. For example, at 120 kHz, a bandwidth of at least 12 kHz about 120 kHz (i.e., from 114 kHz to 126 kHz) is necessary to be considered an ultrabroad bandwidth. The invention also addresses the introduction of the ultrasound generated at a frequency over the ultrabroad bandwidth into a fluid and its impact on performance.

In general, one or more ultrasonic generators drive one or more ultrasonic transducers or arrays of transducers, in accordance with the embodiments described herein, coupled to a liquid to clean and/or process a part or parts. The liquid is preferably contained within a tank, and the one or more ultrasonic transducers mount on or within the tank to impart ultrasound into the liquid. In this context, an ultrasonic transducer is particularly directed to one or more of the aspects and advantages described herein.

A sandwich type ultrasonic transducer having a low-density back mass (i.e., aluminum, magnesium, etc.) used to produce a device with an especially wide bandwidth. This large bandwidth allows effective sweeping over a dramatically larger range of frequencies. A low-density back mass provides a larger surface area compared to that of a prior art steel back mass of the same acoustic length. This increased surface area also allows higher heat dissipation per transducer that in turn allows a higher overall power output at the primary as well as overtone frequencies.

Another improvement is non-silvered piezoelectric ceramics. Elimination of the oft-applied silver to the faces of the piezoelectric ceramic is accomplished through a lapping process that ensures extreme flatness of the piezoelectric ceramics. These flat non-silvered surfaces optimize utilization for high power applications. A transducer characterized by an especially high bandwidth may or may not contain non-silvered piezoelectric resonators. An example of another improvement is the incorporation of multiple concentric ceramic piezoelectric elements in place of the solid ceramic piezoelectric discs often used. In one application the size and geometry of these concentric cylindrical shells are tailored to ensure that the radial resonant frequencies of the resonators do coincide with that of the transducer assembly for maximized output at that frequency. In another application these concentric rings are tailored to ensure that the radial resonant frequencies of the resonators do not coincide with that of the transducer assembly to minimize strain at those frequencies. These resonators can be silvered or lapped free of silver.

An example of another improvement is a deviation from cylindrical symmetry on any of the components for the reason of yielding a device of extreme bandwidth as well as the manipulation/elimination of radial resonant frequencies. An example of this deviation from cylindrical symmetry includes slots on the sides of the front mass or elliptical masses. If properly implemented, deviation from cylindrical symmetry, including the addition of flats or slots on the sides of the high power ultrasonic transducer front mass, can result in a device with exceptionally large bandwidth. In a similar way to concentric ceramics, it can also result in a transducer having radial resonance frequencies that are tailored with respect to the rest of the frequency spectrum, specifically the longitudinal resonances. Large bandwidth allows effective sweeping over a dramatically larger range of frequencies. This transducer is designed specifically to have as flat an impedance verses frequency curve as possible in the region of said transducer's resonance, or any of its overtones. This design feature is intended to maximize the benefits obtained from the sweeping of frequencies within some bandwidth about some center frequency. Sweeping frequency, the most primitive type of frequency modulation (FM), has had a major impact on the ultrasonic cleaning industry over the last twelve years. When done correctly, it improves the performance of an ultrasonic cleaner and generally reduces the damage to delicate parts caused by constant frequency ultrasonics. Introducing a change in the frequency, as a function of time, of an ultrasonic array can effect what happens in a tank in a number of ways. This includes how energy is transferred to the fluid, how efficiently that sound energy is converted into cavitational energy, and how energy is transferred to a part. Once a certain amount of ultrasonic energy has been transferred to the fluid medium one must examine how much of that energy is expressed in the form of cavitation. An effective way of representing this is with a mathematical tool known as the acoustic interaction cross-section. The acoustic interaction cross-section is given by the ratio of the time-averaged power subtracted from an incident acoustic wave as a result of the presence of a bubble, of some size R, to the intensity of the incident acoustic wave. Simply, this is the amount of energy subtracted from an incident acoustic wave by a bubble driven into oscillation. This energy is subsequently re-radiated by the bubble via pulsation or implosion and affects much of the cleaning accomplished by ultrasonics. As its name suggests, acoustic interaction cross-section has the units of area, i.e., square meters.

The cross-section is strongly a function of a bubble's radius, this means that a single frequency picks out its favorite sized bubble and pumps energy into it preferentially. The resonant bubble radius, at that frequency, is approximately determined by the following equation:

$$R_0 = \frac{1}{\omega_0} \cdot \sqrt{\frac{3\kappa p_0}{\rho}} \qquad \text{eq. 1)}$$

Where: $\kappa$=polytropic index $p_0$=hydrostatic liquid pressure outside the bubble $\rho$=medium density $\omega$=2 $\pi$f For most aqueous solutions we use $\kappa$=1.3, $p_0$=$10^6$ dynes/$cm^2$, $\rho$=1 gm/$cm^3$. This gives a bubble radius of 0.008 cm. If we sweep the frequency we are then exciting a range of bubble sizes. For a sweep of plus or minus 2 kHz all of the bubbles whose sizes range from 0.0075 cm and 0.0083 cm are maximally excited. Bubbles whose sizes differ from the resonant size interact less strongly with the incident acoustic field and subsequently absorb less energy for cavitation. This line of thinking would indicate that the larger the sweep bandwidth the better the activity. This is true only to a point. As a transducer is driven off of it's primary resonance, the efficiency with which it converts electrical energy to mechanical energy decreases. It becomes a game of diminishing returns, a larger sweep bandwidth allows you to excite a larger bubble population but with little energy at the ends of the bandwidth. The optimum transducer is designed with a wide bandwidth resonance allowing a significant transfer of ultrasonic energy into the tank over the entire sweep range.

Another improvement, referred to herein as "diaphragm flapping," includes creating non-supported regions at the face of a high power ultrasonic resonating component. These non-supported regions give rise to local areas that undergo high amplitude, or diaphragm like, oscillations. Such regions of large displacement and velocity enhancement increase the action of directed acoustic streaming in a fluid media for the purpose of particle removal.

In one aspect, a transducer assembly for receiving a stimulating signal and producing ultrasound therefrom at two or more frequencies, over an ultrabroad bandwidth at each frequency, includes a front mass disposed about a central axis and a back mass disposed about the central axis, laterally offset from the front mass. The transducer further includes one or more resonators disposed about the central axis and between the front mass and the back mass, including at least one electrical contact for receiving the stimulating signal. The back mass consists of a low-density material. In one embodiment, the low-density material includes aluminum or an aluminum alloy. In another embodiment, the low-density material includes magnesium or a magnesium alloy.

In another embodiment, the low-density material is characterized by a density of less than 6.0 g/cc.

In another embodiment, the front mass includes a front bore disposed about the central axis and passing at least partially through the front mass. The back mass includes a back bore disposed about the central axis and passing through the back mass. Each of the one or more resonators includes a resonator bore disposed about the central axis and passing through the resonator.

Another embodiment further includes a bias bolt disposed along the central axis, through the back mass, through the one or more resonators, and at least partially through the front mass. The bias bolt adjustably engages the back mass and the front mass so as to compress the one or more resonators between the back mass and the front mass.

In another embodiment, each of the one or more resonators is characterized by at least one non-silvered face. In another embodiment, all of the faces of the one or more resonators are non-silvered. In yet another embodiment, all of the faces of the one or more resonators are silvered.

In another embodiment, the front mass is characterized by radial symmetry about the central axis. In another embodiment, the front mass is characterized by a deviation from radial symmetry about the central axis. In one embodiment, the deviation from radial symmetry includes lateral slots formed in the outer surface of the front mass parallel to the central axis. In another embodiment, the deviation from radial symmetry includes an elliptical cross section of the front mass in a plane perpendicular to the central axis. In one embodiment, the deviation from radial symmetry includes flat regions along the outer surface of the front mass parallel to the central axis.

In another embodiment, the front mass includes one or more non-supported regions near an outer face of the front mass.

In another embodiment, each of the one or more resonators is characterized by a size that produces radial resonant frequencies in the resonator coinciding with two or more resonant frequencies of the transducer assembly. The size is chosen to maximize the ultrasonic power output of the transducer assembly at the two or more resonant frequencies of the transducer assembly.

In another embodiment, each of the one or more resonators is characterized by a size that produces radial resonant frequencies in the resonator not coinciding with two or more resonant frequencies of the transducer assembly. The size is chosen to minimize strain on the transducer assembly at the two or more resonant frequencies of the transducer assembly.

Another embodiment further includes an electrical contact disposed between the back mass and a next adjacent resonator.

In another aspect, a transducer assembly for receiving a stimulating signal and producing ultrasound therefrom at two or more frequencies, over an ultrabroad bandwidth at each frequency, includes a front mass disposed about a central axis, and a back mass disposed about the central axis, laterally offset from the front mass. The transducer assembly further includes one or more resonators disposed about the central axis and between the front mass and the back mass, including at least one electrical contact for receiving the stimulating signal. Each of the one or more resonators is characterized by at least one non-silvered face.

In another aspect, a transducer assembly for receiving a stimulating signal and producing ultrasound therefrom at two or more frequencies, over an ultrabroad bandwidth at each frequency, includes a front mass disposed about a central axis and a back mass disposed about the central axis, laterally offset from the front mass. The transducer assembly further includes one or more resonators disposed about the central axis and between the front mass and the back mass, including at least one electrical contact for receiving the stimulating signal. The front mass is characterized by a deviation from radial symmetry about the central axis.

In another aspect, a transducer assembly for receiving a stimulating signal and producing ultrasound therefrom at two or more frequencies, over an ultrabroad bandwidth at each frequency, includes a front mass disposed about a central axis and a back mass disposed about the central axis, laterally offset from the front mass. The transducer assembly further includes one or more resonators disposed about the central axis and between the front mass and the back mass, including at least one electrical contact for receiving the stimulating signal. Each of the one or more resonators is characterized by a size that produces radial resonant frequencies in the resonator coinciding with two or more resonant frequencies of the transducer assembly. The size is chosen to maximize an ultrasonic power output of the transducer assembly at the one or more resonant frequencies of the transducer assembly.

In another aspect, a transducer assembly for receiving a stimulating signal and producing ultrasound therefrom at two or more frequencies, over an ultrabroad bandwidth at each frequency, includes a front mass disposed about a central axis and a back mass disposed about the central axis, laterally offset from the front mass. The transducer assembly further includes one or more resonators disposed about the central axis and between the front mass and the back mass, including at least one electrical contact for receiving the stimulating signal. Each of the one or more resonators is characterized by a size that produces radial resonant frequencies in the resonator not coinciding with two or more resonant frequencies of the transducer assembly. The size is chosen to minimize strain on the transducer assembly at the one or more resonant frequencies of the transducer assembly.

In another aspect, a transducer assembly for receiving a stimulating signal and producing ultrasound therefrom at two or more frequencies, over an ultrabroad bandwidth at each frequency, includes a front mass disposed about a central axis and a back mass disposed about the central axis, laterally offset from the front mass. The transducer assembly further includes one or more resonators disposed about the central axis and between the front mass and the back mass, including at least one electrical contact for receiving the stimulating signal. The front mass includes one or more non-supported regions near an outer face of the front mass.

In another aspect, a method of producing ultrasound at two or more frequencies, over an ultrabroad bandwidth at each frequency, includes forming a back mass from a low-density material, and compressing one or more resonators between a front mass and the back mass, so as to produce an ultrasound transducer. The method further includes driving the ultrasound transducer with a stimulating signal characterized by at least one of the one or more frequencies.

In another aspect, a system for producing ultrasound at two or more frequencies, over an ultrabroad bandwidth at each frequency, includes at least one transducer assembly including (i) a front mass disposed about a central axis, (ii) a back mass disposed about the central axis, laterally offset from the front mass, and (iii) one or more resonators disposed about the central axis and between the front mass and the back mass. The resonantors include at least one electrical contact for receiving the stimulating signal. The back mass consists of a low-density material. The system further includes at least one ultrasound signal generator for generating a stimulating signal corresponding to at least one of the one or more frequencies. The at least one ultrasound generator provides the stimulating signal to the at least one transducer assembly.

In another aspect, a transducer assembly for receiving a stimulating signal and producing ultrasound therefrom at two or more frequencies, over an ultrabroad bandwidth at each frequency, includes a front mass made of type 2024 aluminum, disposed about a central axis, and a back mass made of type 7075-T651 aluminum, disposed about the central axis, laterally offset from the front mass. The transducer assembly further includes one or more resonators disposed about the central axis and between the front mass and the back mass, including at least one electrical contact for receiving the stimulating signal. The front mass includes (i) a first flat surface disposed parallel to the central axis on at least a portion of an outside surface of the front mass, (ii) a second flat surface disposed parallel to the central axis on at least a portion of the outside surface of the of the front mass. The first flat surface is parallel to the second flat surface and on the opposite side of the central axis with respect to the second flat surface.

In another embodiment, the two or more frequencies includes 40 kHz, 80 kHz, 120 kHz, 140 kHz, 170 kHz, 220 kHz, and 270 kHz.

In another embodiment, each of the one or more resonators is characterized by at least one non-silvered face. In another embodiment, at least one of the one or more resonators is characterized by at least one non-silvered face. In one embodiment, all of the faces of the one or more resonators are non-silvered. In yet another embodiment, all of the faces of the one or more resonators are silvered.

Another embodiment further includes an electrical contact disposed between the back mass and a next adjacent resonator.

In another embodiment, the front mass is symmetrically disposed about the central axis.

In another embodiment, the front mass includes a cylindrical portion disposed about the central axis having a diameter of approximately 1.75 inches, and extending along the central axis for approximately 0.38 inches. The front mass further includes a conical portion (conical section) extending along the central axis for approximately 0.5 inches. The conical portion has an initial diameter of approximately 1.75 inches at an inner end of the conical portion adjacent to the cylindrical portion, and linearly decreases to a diameter of approximately 1.55 inches at an outer end of the conical portion.

In another embodiment, the first flat surface and the second flat surface are separated by a distance of approximately 1.642 inches.

BRIEF DESCRIPTION OF DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENTS

Figure 1:
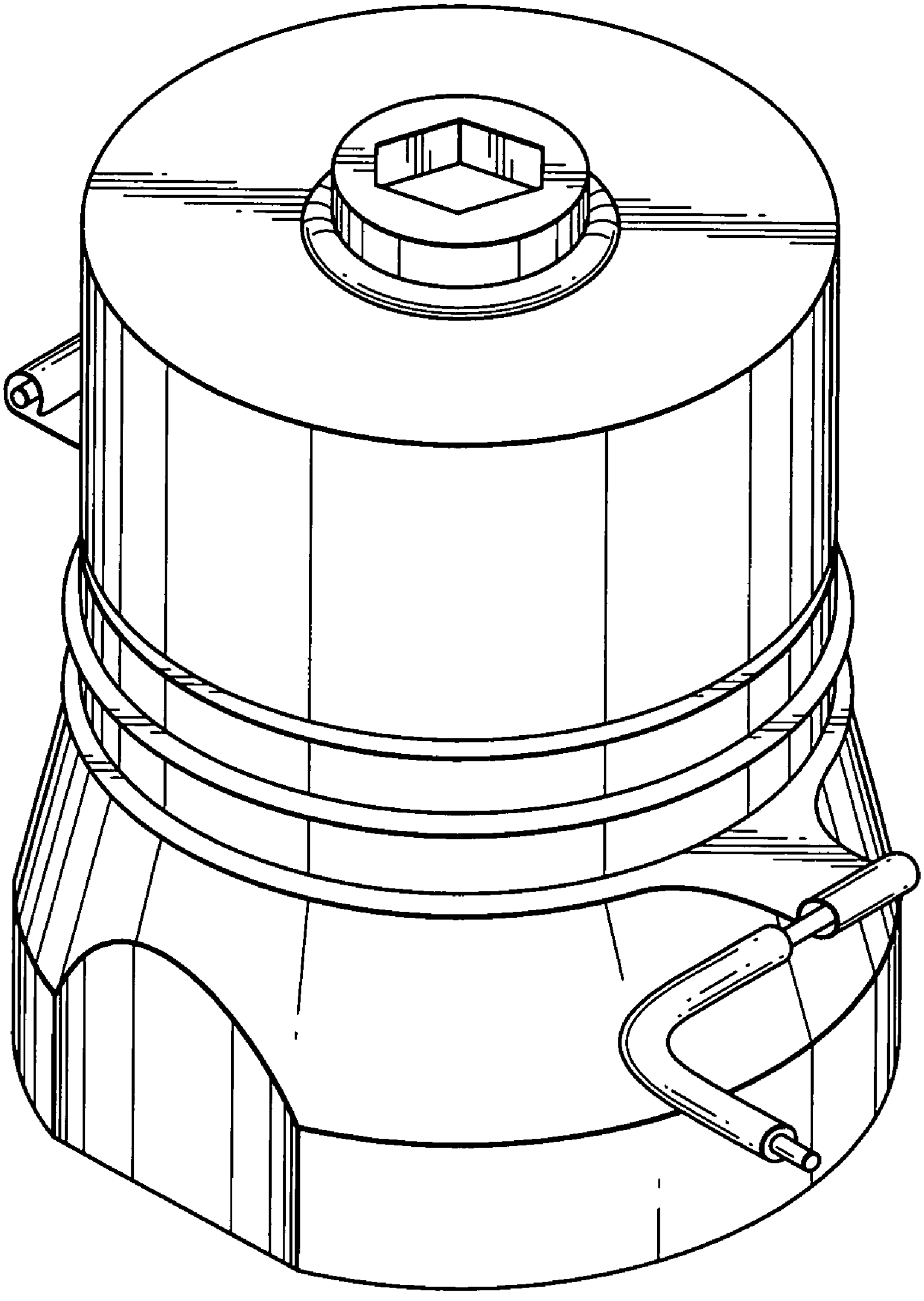
FIG. 1 shows a perspective view of one preferred embodiment of a high power, broadband ultrasonic transducer.
Figure 2:
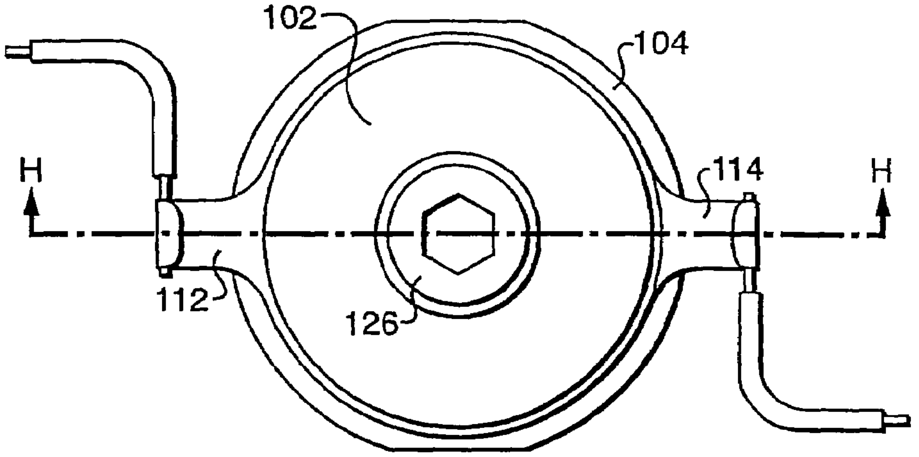
FIG. 2 shows a top view of the transducer of FIG. 1.
Figure 3:
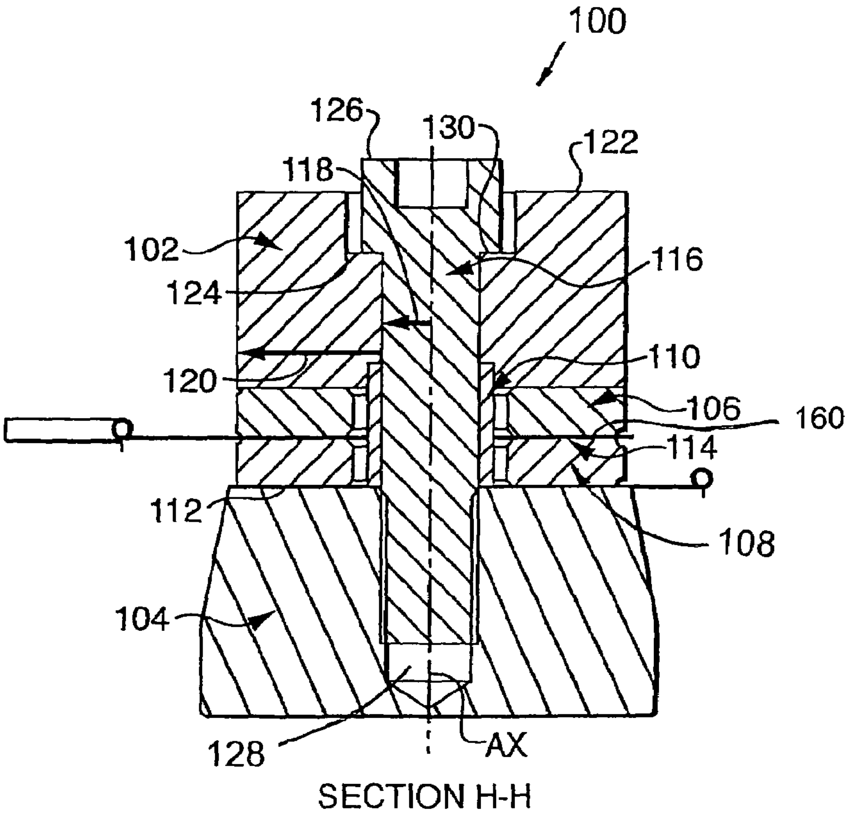
FIG. 3 shows a sectional view of the transducer of FIG. 1.

FIG. 1 shows a perspective view of one preferred embodiment of a high power, broadband ultrasonic transducer 100. FIG. 2 shows a top view of the transducer 100 of FIG. 1, and FIG. 3 shows a sectional view (section H-H from FIG. 2) of the transducer 100 of FIG. 1. The transducer 100 is a wide bandwidth Langevin architecture, also known in the art as a sandwich transducer. The transducer 100 includes a back mass 102, a front mass 104, a first ceramic disc resonator 106, a second ceramic disc resonator 108, an insulator 110, a first electrode 112, a second electrode 114 and a bias bolt 116. In the embodiment of FIGS. 1, 2 and 3, the back mass 102, front mass 104, first ceramic disc 106, second ceramic disc 108, and the insulator 110 are each characterized by a substantially annular shape, characterized by an inner radius 118 and an outer radius 120. The inner radius 118 and outer radius 120 are shown in FIG. 3 for the back mass 102 only. Each of the other components (the front mass 104, the ceramic discs 104 and 106, and the insulator 110) is characterized by corresponding inner radius and outer radius, which may or may not be the same as the other components in the transducer 100. The inner radius 118 of the back mass 102 undergoes an abrupt change near the outside end 122, forming a shelf 124 in the inner bore.

In the embodiment shown in FIG. 3, the bore of the front mass 104, characterized by the inner radius of the front mass 104, does not extend completely through the front mass 104 along the axis AX. Other embodiments may include an inner bore of the front mass 104 that extends completely through the front mass 104. The front mass 104 further includes threads along the walls of the inner bore. In one preferred embodiment the threads are machined into the inner bore, although other techniques known in the art may also be used to create threads in the inner bore. In one embodiment, each of the one or more resonators is characterized by at least one non-silvered face 160. In another embodiment, at least one of the one or more resonators is characterized by at least one non-silvered face 160. In another embodiment, all of the faces of the one or more resonators are non-silvered.

The back mass 102, front mass 104, first ceramic disc 106 and second ceramic disc 108 are stacked so as to be adjacent and disposed along a common axis AX, as shown in FIG. 3. The first ceramic disc 106 and the second ceramic disc 108 are “sandwiched” between the back mass 102 and the front mass 104. The bias bolt 116 is preferably symmetrically disposed about the common axis AX, and includes a first end 126 and a second end 128. The outer radius near first end 122 is characterized by an abrupt change, forming a shelf 130. The second end 128 includes threads along the outer surface for mating with the threads along the walls of the inner bore of the front mass 104. The transducer 100 is assembled by passing the bias bolt 116 through the bore of the back mass 102, the bore of the first ceramic disc 106, the bore of the second ceramic disc 108, and into the bore of the front mass 104, as shown in FIG. 3. The insulator 110 is disposed between the bias bolt 116 and the ceramic discs, and electrically insulates the ceramic discs from the bias bolt 116. The threads on the bias bolt 116 engage the threads in the bore of the front mass 104. As the bias bolt 116 is tightened, the bias bolt 116 is drawn into the bore front mass 104, and the shelf 130 on the bias bolt 116 contacts the shelf 124 on the back mass 102, thereby applying a force to the back mass 102 along the axis AX towards the front mass 104. Further tightening the bias bolt 116 compresses the first ceramic disc 106 and the second ceramic disc 108 between the front mass 104 and the back mass 102. The bias bolt 116 can be tightened or loosened to adjust the amount of compression on the ceramic discs.

The first electrode 112 and the second electrode 114 provide input ports to the resonators for a stimulating signal from an ultrasonic signal generator. In some embodiments of the transducer 100, the resonators may receive the stimulating signal via an electrically conducting front mass and/or an electrically conducting back mass, instead of or in addition to the electrodes. The resonator components within the transducer 100 spatially oscillate in one or more modes associated with the frequency of the applied stimulating signal. The transducer 100 transmits the spatial oscillations via the front mass as ultrasound, to (for example) a tank that contains a cleaning solution and an object to be cleaned.

The back mass 102 is fabricated from a low-density material (with respect to prior art back mass components) such as aluminum, magnesium, beryllium, titanium, or other similar materials known in the art, including alloys and other mixed composition materials. As used herein, the term "low density material" describes a material with a density of less than 6.0 grams per cubic centimeter (g/cc). In one preferred embodiment, the back mass 102 is made of type 7075-T651 aluminum, although other similar materials may also be used. In a preferred embodiment, the front mass 104 is made of type 2024 aluminum, although other similar materials may also be used. The back mass 102 and front mass 104 being made from different materials contributes to the ultrabroad bandwidth of the transducer 100. A low density back mass 104 results in a physically longer backmass, or a larger surface area as compared to a higher density back mass of the same acoustic length. The increased length (or larger surface area) further contributes to the multiple center frequencies of operation, and the ultrabroad bandwidth at each of the center frequencies. In the embodiment shown in FIGS. 1, 2 and 3, the disc resonators 106 and 108 are fabricated from a ceramic material that has been polarized via techniques well know in the art to imbue a piezoelectric effect. In other embodiments, the resonators may include other piezoelectric materials known in the art, such as natural piezoelectrics (e.g., quartz) or magnetorestrictives. Further, although the embodiment of FIGS. 1, 2 and 3 includes two disc resonators, other embodiments of the transducer 100 may include a single resonator, or multiple (i.e., more than two) resonators.

Figure 4A:
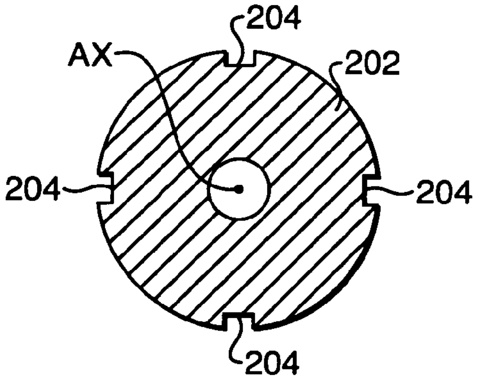
FIG. 4A shows a front mass that deviates from cylindrical symmetry by including lateral slots, parallel to the central axis AX.
Figure 4B:
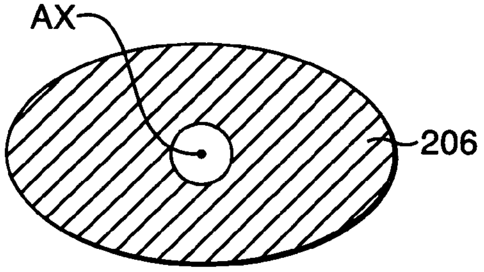
FIG. 4B shows a front mass that deviates from cylindrical symmetry by including an elliptical cross section in a plane perpendicular to the central axis AX.
Figure 4C:
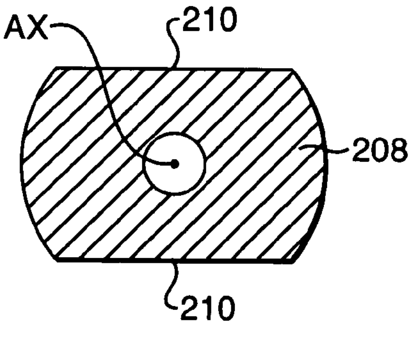
FIG. 4C shows a front mass that deviates from cylindrical symmetry by including flat regions along the outer surface of the front mass, running parallel to the central axis AX.

The transducer 100 of FIGS. 1, 2 and 3 include components that are cylindrically symmetrical (also referred to herein as "radially symmetrical") about the central axis AX. Other embodiments of the transducer 100 may include transducer components that deviate from cylindrical symmetry (also referred to herein as "radial symmetry"), as shown for example in FIGS. 4A, 4B and 4C. The front mass 202 shown in cross section (in a plane parallel to the central axis AX) in FIG. 4A deviates from cylindrical symmetry by including lateral slots 204, parallel to the central axis AX, on the front mass 202. Another exemplary deviation from cylindrical symmetry is a front mass 206 with an elliptical cross section in a plane perpendicular to the central axis AX, as shown in FIG. 4B. A further exemplary deviation from cylindrical symmetry is a front mass 208 with flat regions 210 along the outer surface of the front mass, running parallel to the central axis AX, as shown in FIG. 4C. Such deviations from cylindrical symmetry exemplified by the embodiments of FIGS. 4A, 4B and 4C result in transducer devices that have empirically demonstrated extremely wide bandwidth, and allow tailoring, manipulation or elimination of radial resonant frequencies. In a similar way to concentric ceramics, variations from cylindrical symmetry can also result in a transducer having radial resonance frequencies that are tailored to be compatible with other transducer resonances, specifically the longitudinal resonances. A large transducer bandwidth allows effective sweeping over a dramatically wide range of frequencies. The transducer described herein provides a substantially flat impedance verses frequency curve in the region of the transducer's resonance, or any of its overtones. This feature is intended to maximize the benefits obtained from the sweeping of frequencies within some bandwidth about some center frequency.

The transducer 100 can be operated at a dedicated single frequency, or it can be excited at multiple frequencies, i.e., at the transducer fundamental frequency and/or any of its higher frequency overtones. The size and geometry of the ceramic disc resonators 106 and 108 can be tailored to ensure that the radial resonant frequencies of the resonators coincide with that of the transducer assembly for maximized output at that frequency. In yet another embodiment, the size and geometry of the resonators can be tailored to ensure that the radial resonant frequencies of the resonators do not coincide with that of the transducer assembly, in order to minimize strain on the transducer at those frequencies.

Figure 5:
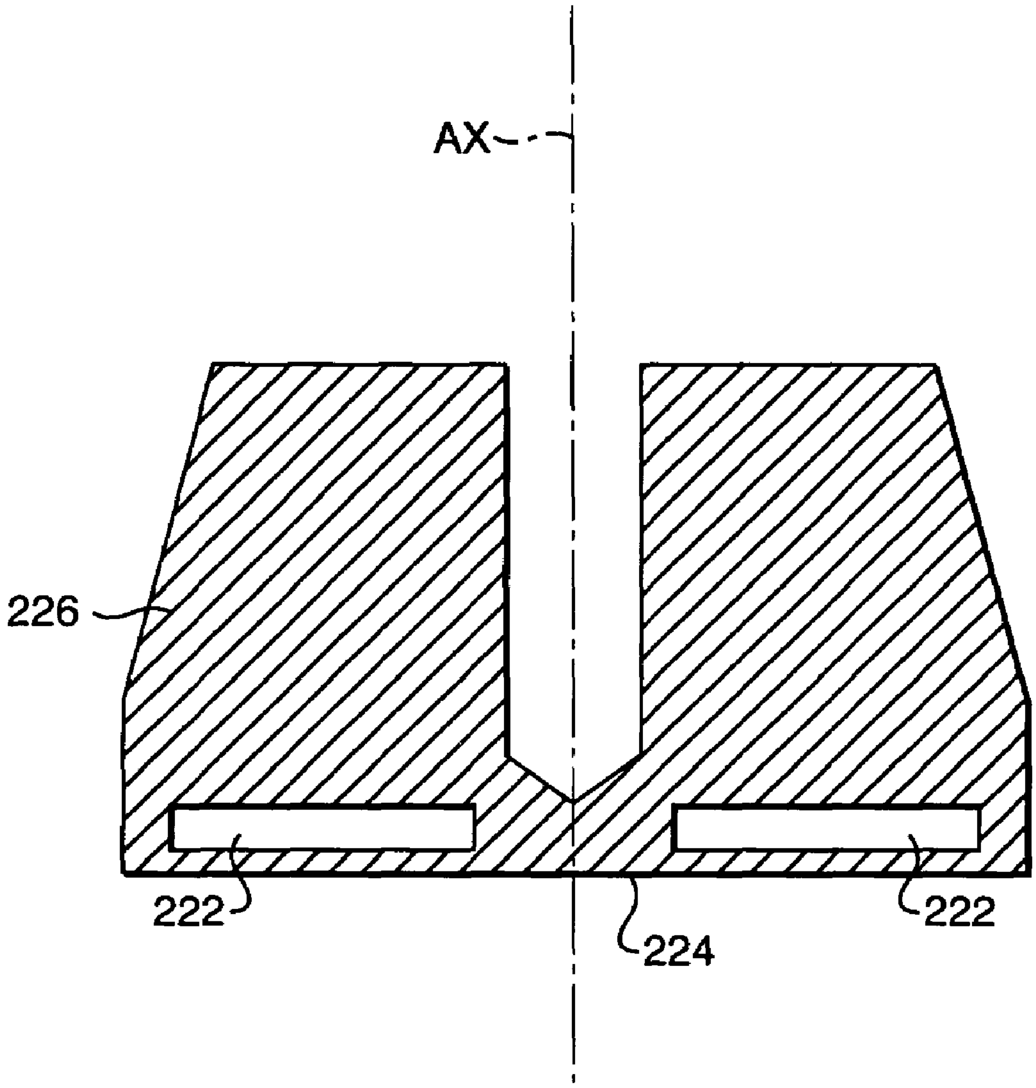
FIG. 5 shows an embodiment of the transducer of FIG. 1 that utilizes diaphragm flapping.

FIG. 5 shows an embodiment of the transducer that utilizes "diaphragm flapping," a term that, as used herein, describes the creation of voids (i.e., non-supported regions) 222 near the face 224 of the front mass 226 of a high power ultrasonic resonating component. These non-supported regions 222, formed in the front mass 226, give rise to local areas that undergo high amplitude, or diaphragm-like, oscillations. Such regions of large displacement and velocity enhancement increase the action of directed acoustic streaming in a fluid media for the purpose of particle removal.

Figure 6:
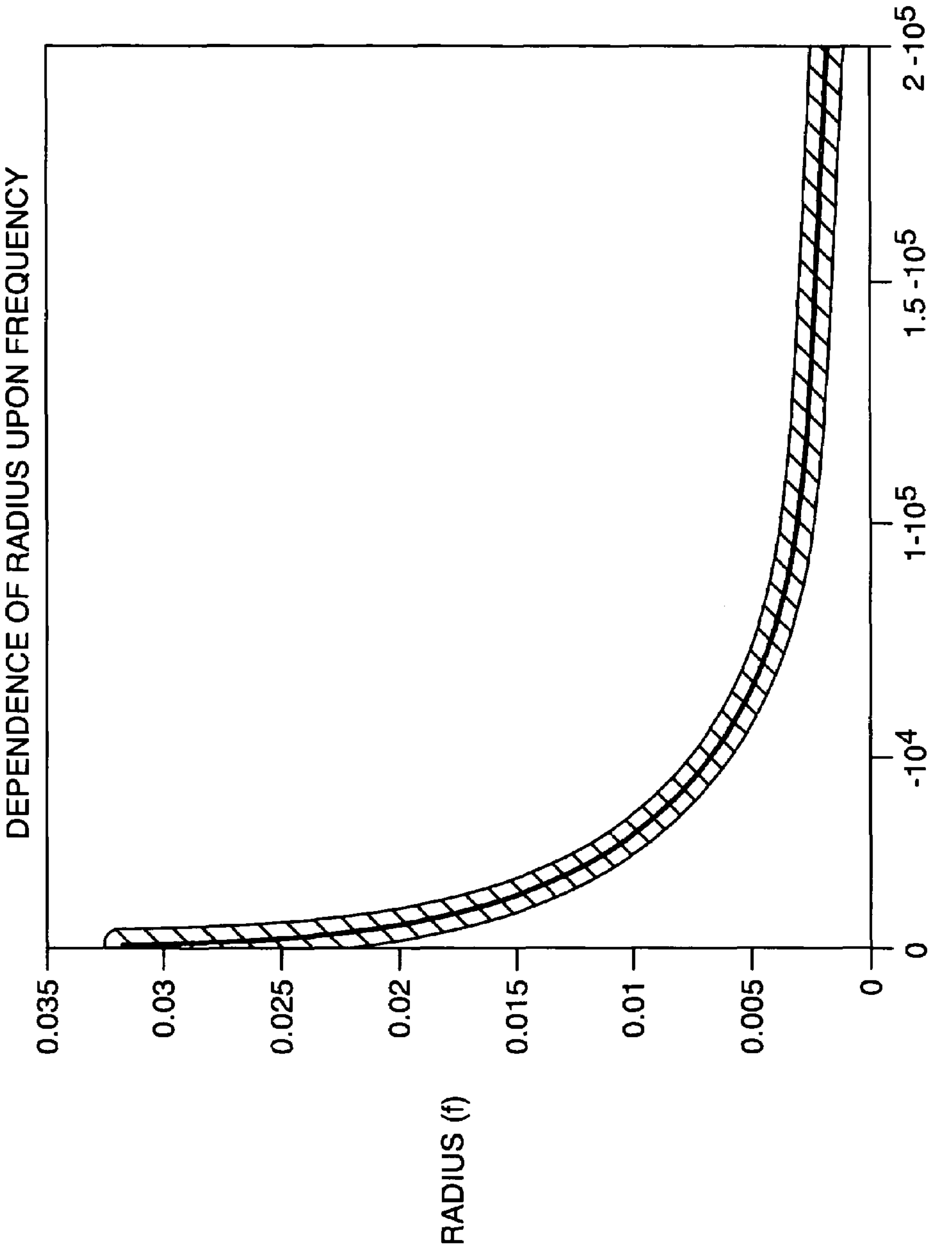
FIG. 6 shows roughly the average cavitation event size as a function of the ultrasound frequency.
Figure 7:
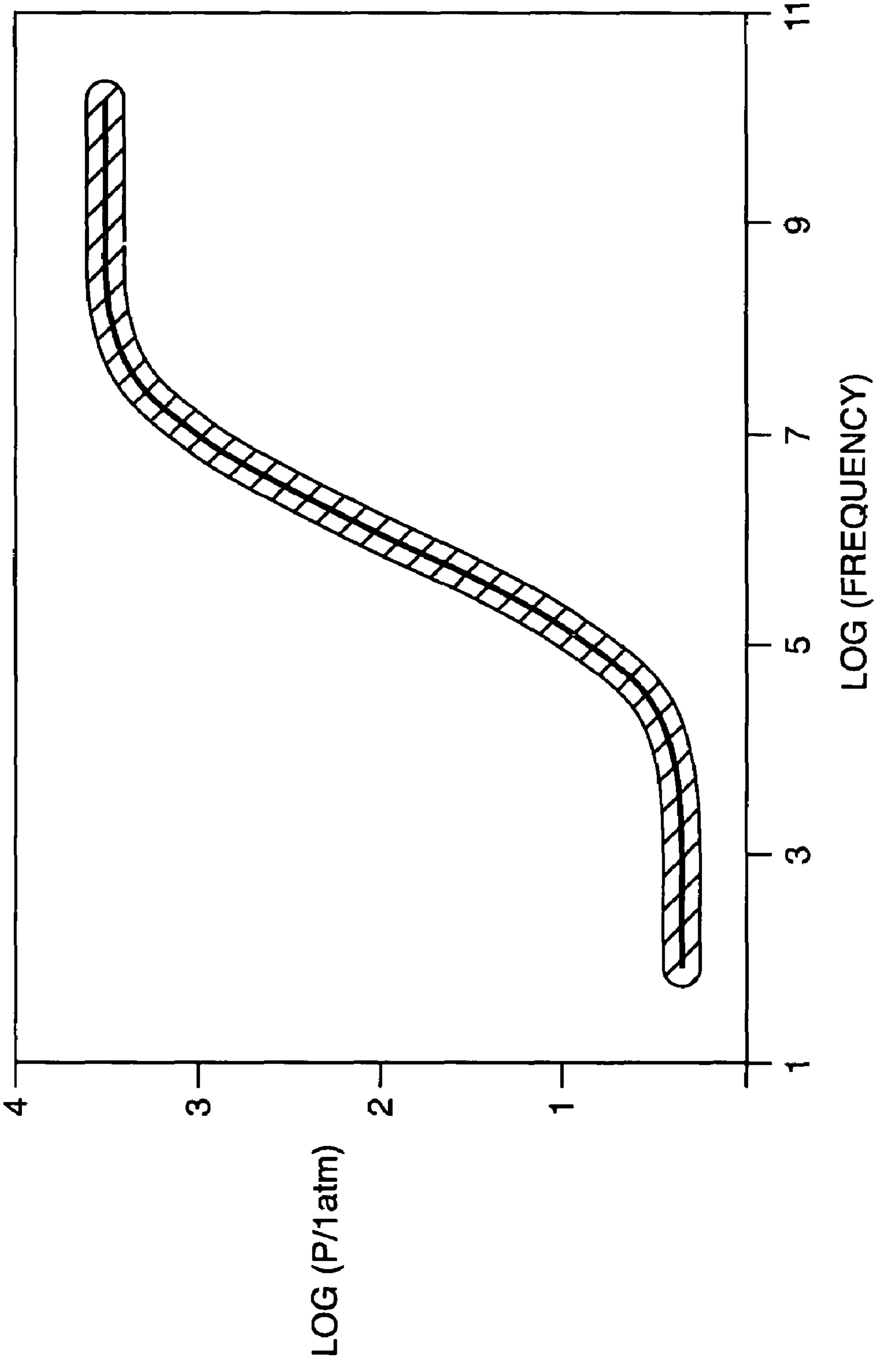
FIG. 7 demonstrates the dependence of cavitation threshold upon frequency.
Figure 8:
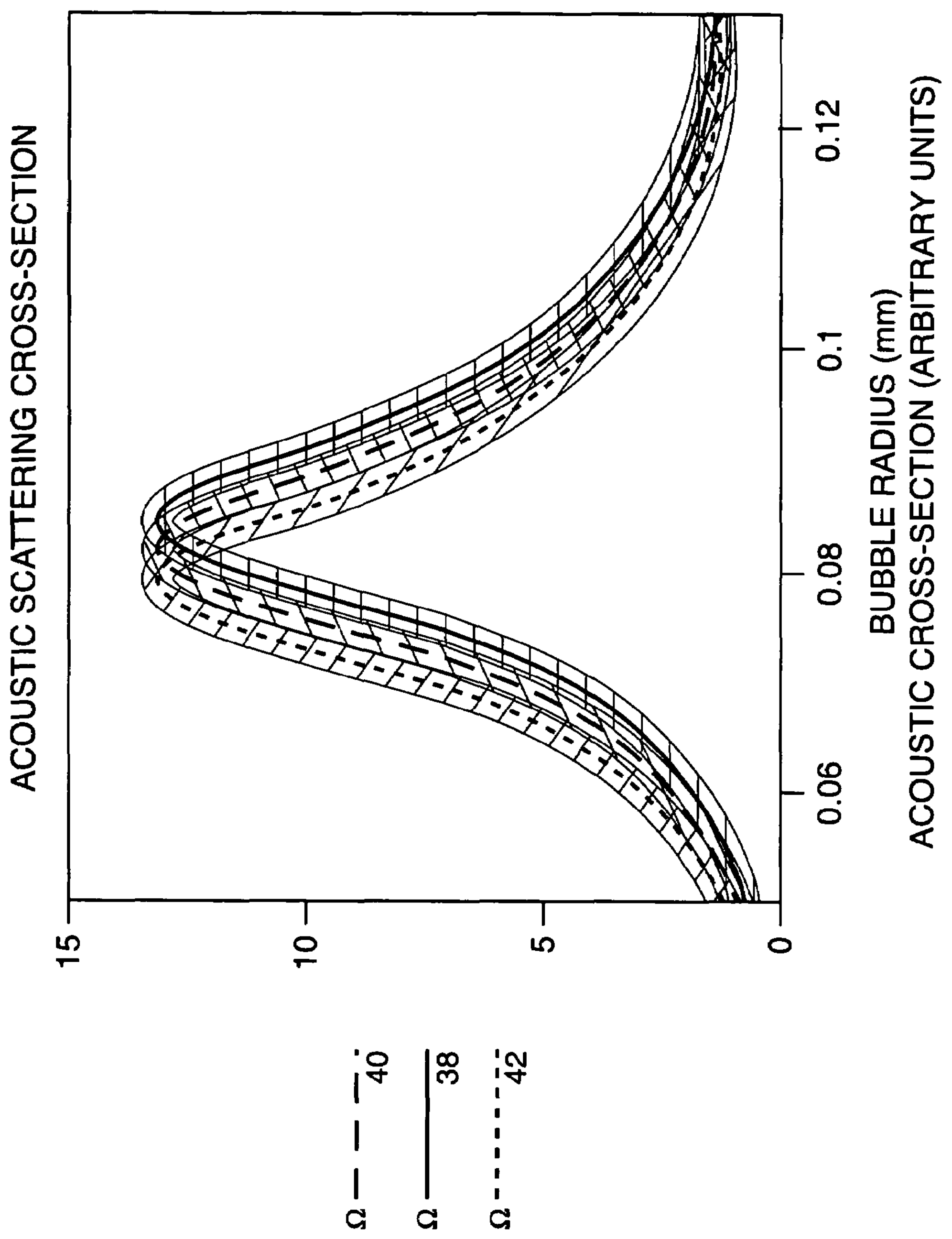
FIG. 8 shows a variable proportional to the acoustic scattering cross section for multiple frequencies over some bandwidth that can effectively swept by a transducer.

FIG. 6 shows roughly the average cavitation event size (within the ultrasound-energized liquid) as a function of the ultrasound frequency. High frequencies yield bubble populations whose number densities peak at smaller bubble radii than lower frequencies. FIG. 7 demonstrates the dependence of cavitation threshold upon frequency. At lower frequencies, i.e., less than 150 kHz, the cavitation threshold is rather modest, but it can be observed to increase dramatically as operation progresses to higher and higher frequencies. Traditionally it is this phenomenon that limits the ability to cavitate a fluid at high frequencies. FIG. 8 shows a variable proportional to the acoustic scattering cross section for multiple frequencies over some bandwidth that can effectively swept by a transducer. This calculation shows how effectively an incident acoustic wave transfers energy to a bubble population. FIG. 8 also demonstrates that the larger the frequency span about some center frequency that can be injected into a tank by a transducer or transducer array, the larger the bubble population that can be stimulated maximally.

Figure 9A:
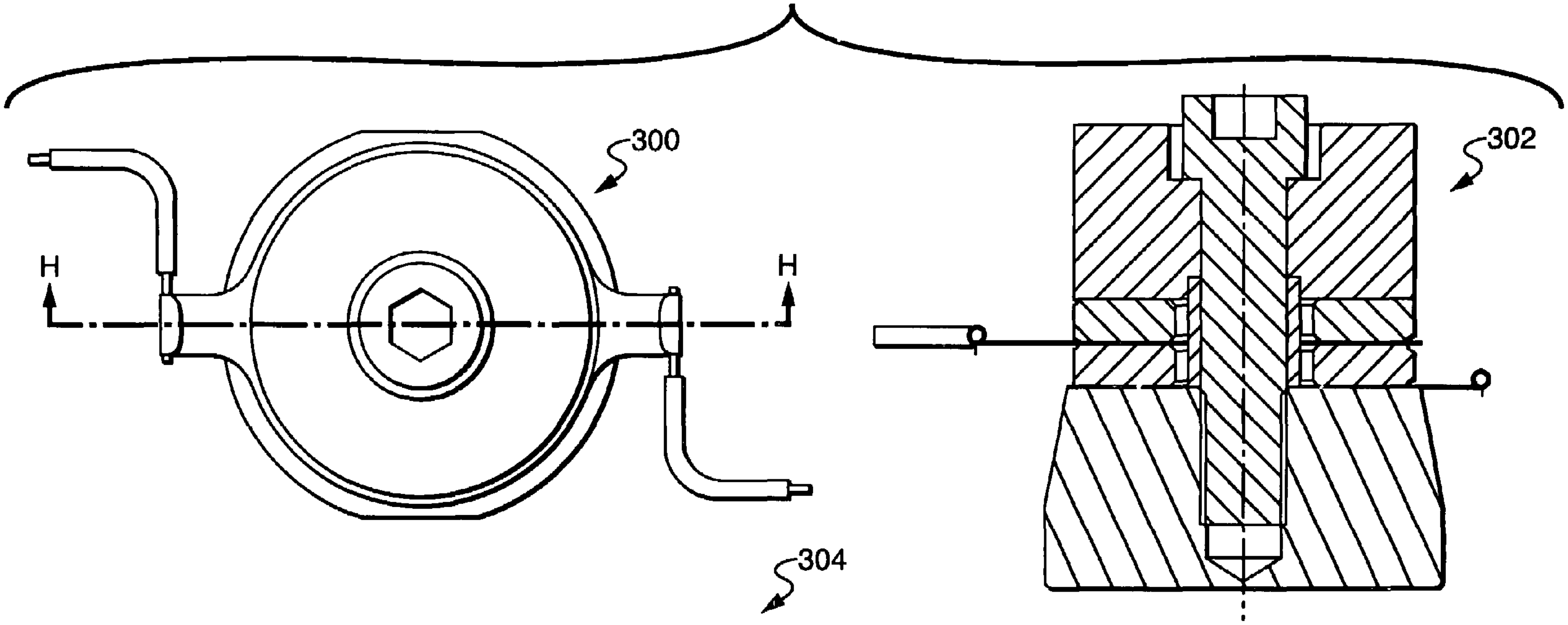
FIG. 9A shows a top view, an associated sectional view and a constituent parts list of one embodiment of a transducer according to the invention.
Figure 9B:
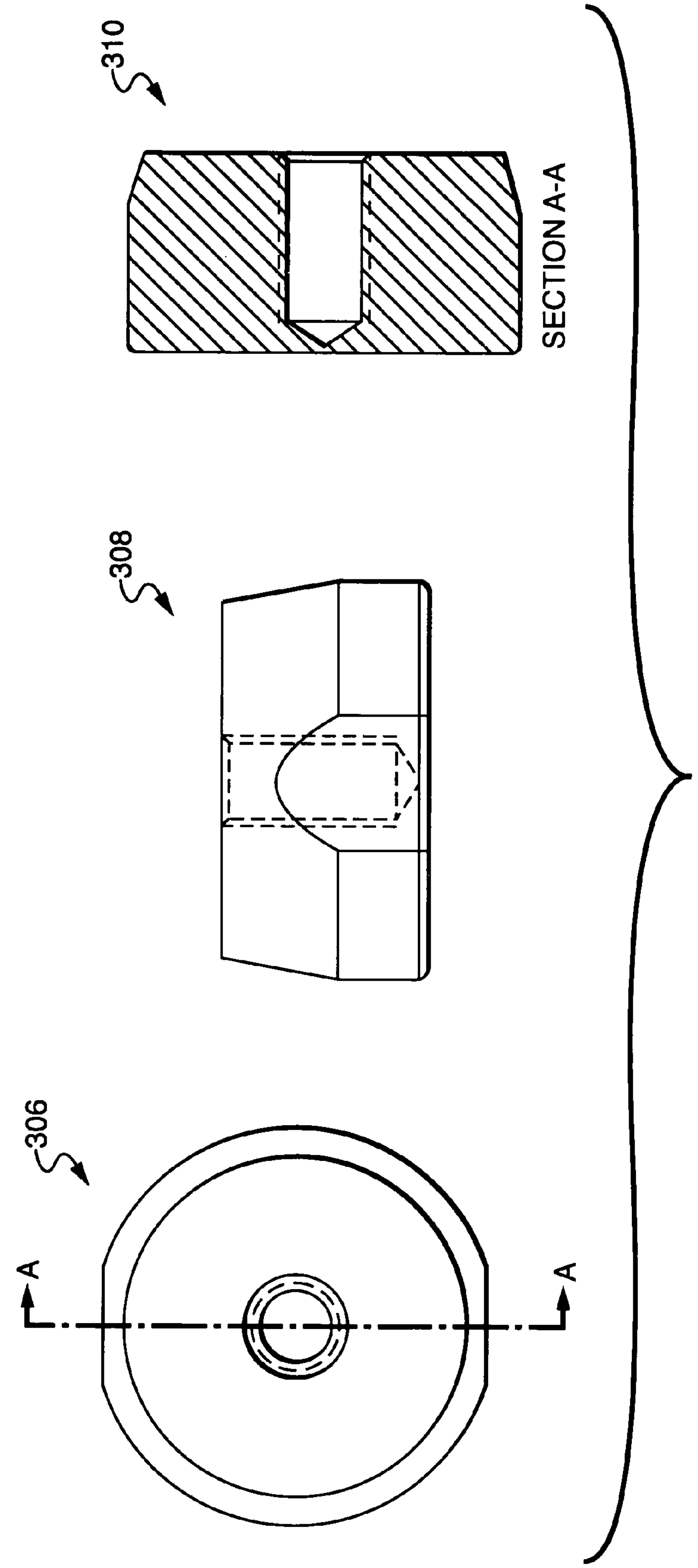
FIG. 9B shows a top view, a side view and an associated sectional view of the front mass of the transducer of FIG. 9A.
Figure 9C:
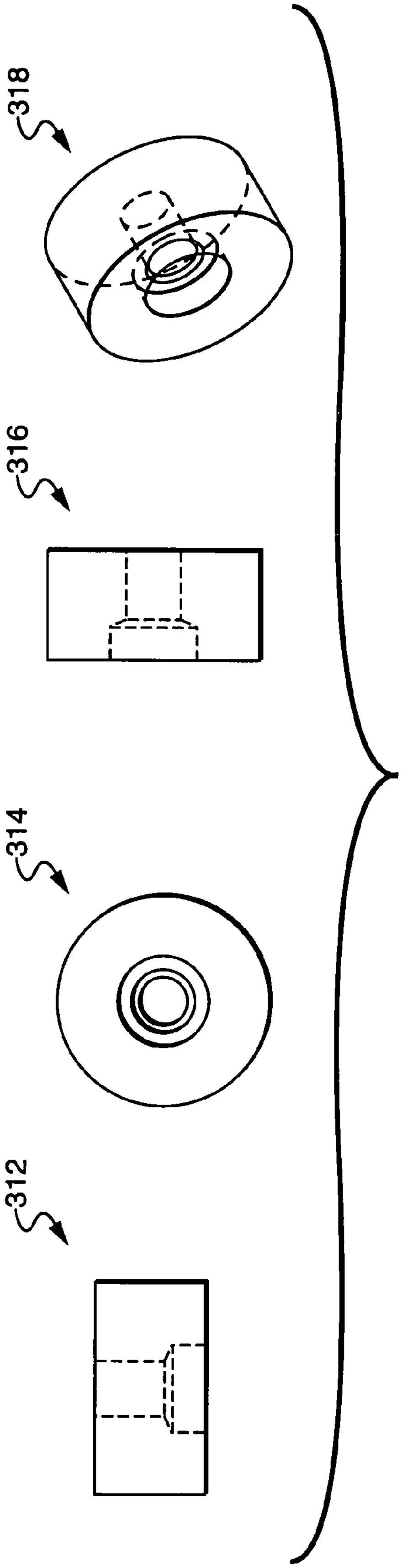
FIG. 9C shows a top view, a front view, a side view and an isometric view of the back mass of the transducer of FIG. 9A.
Figure 9D:
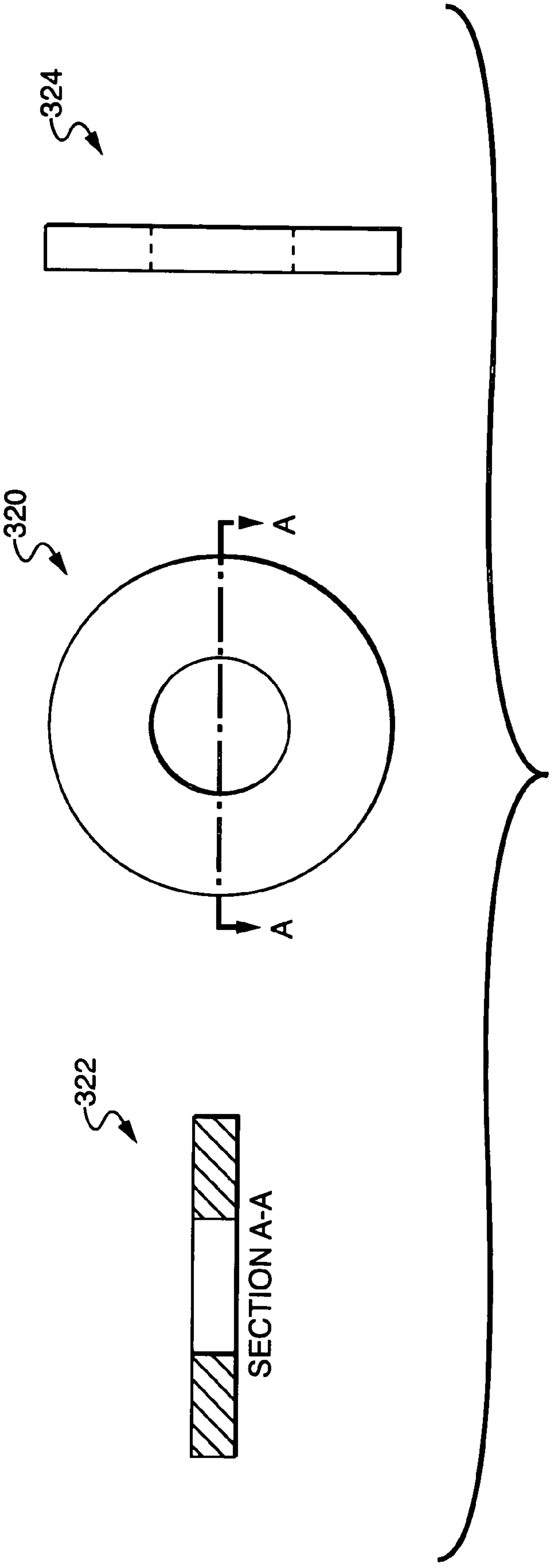
FIG. 9D shows a top view, a front view and a side view of the ceramic disc resonator of the transducer of FIG. 9A prior to lapping.
Figure 9E:
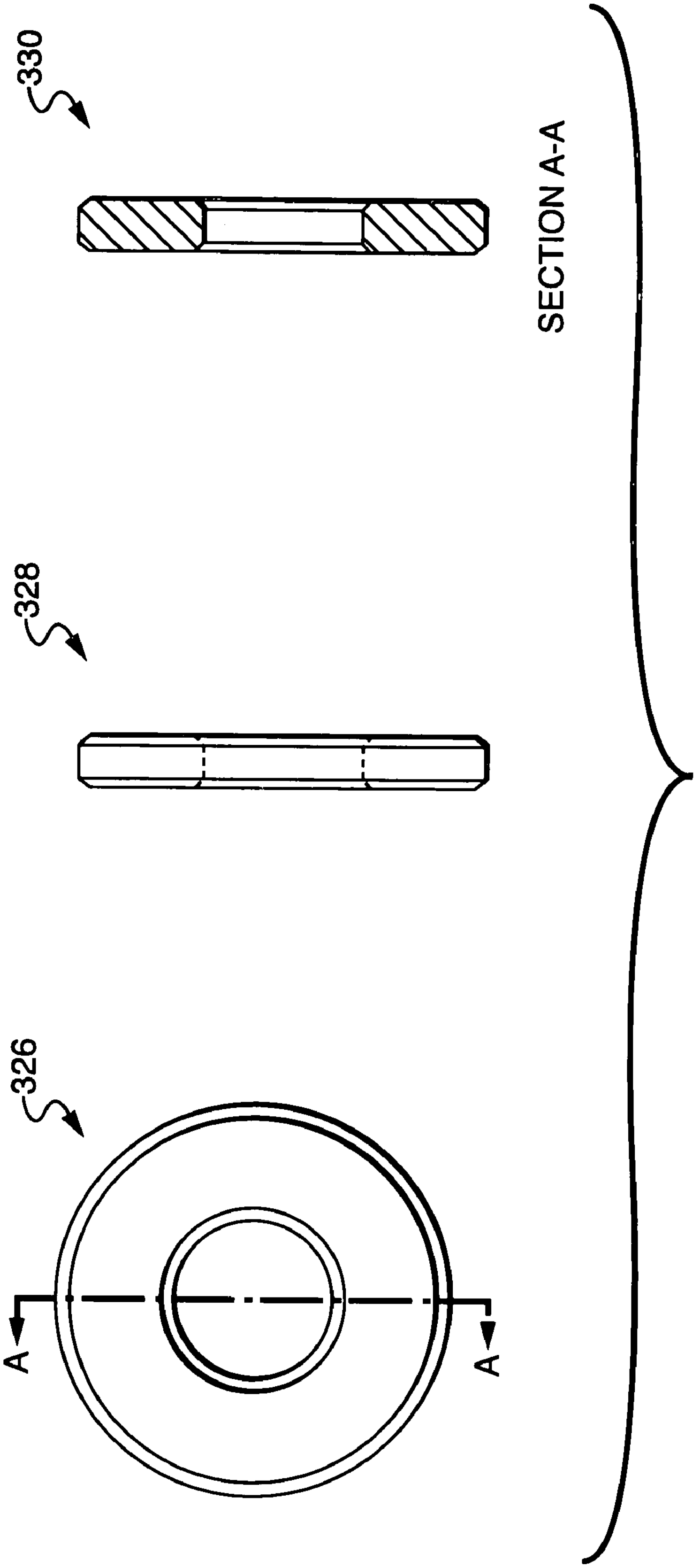
FIG. 9E shows a front view, a side view and an associated sectional view of the ceramic disc resonator of the transducer of FIG. 9A after lapping.
Figure 9F:
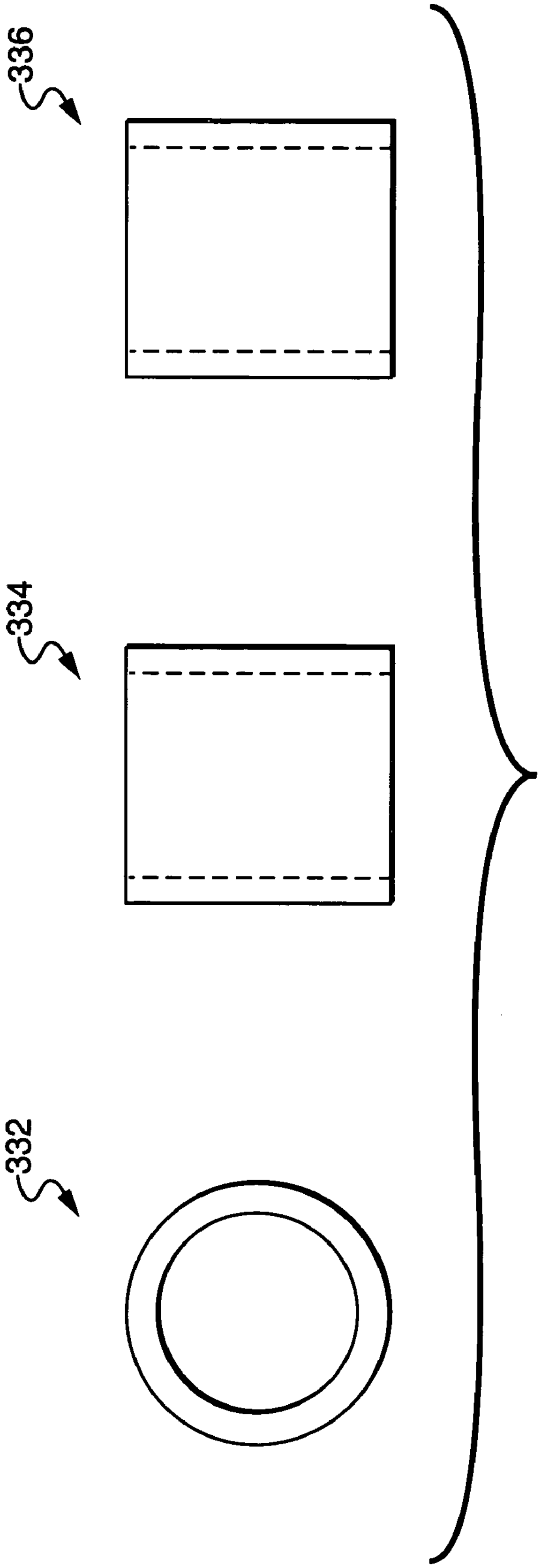
FIG. 9F shows a top view, a front view and a side view of the insulator of the transducer of FIG. 9A.
Figure 9G:
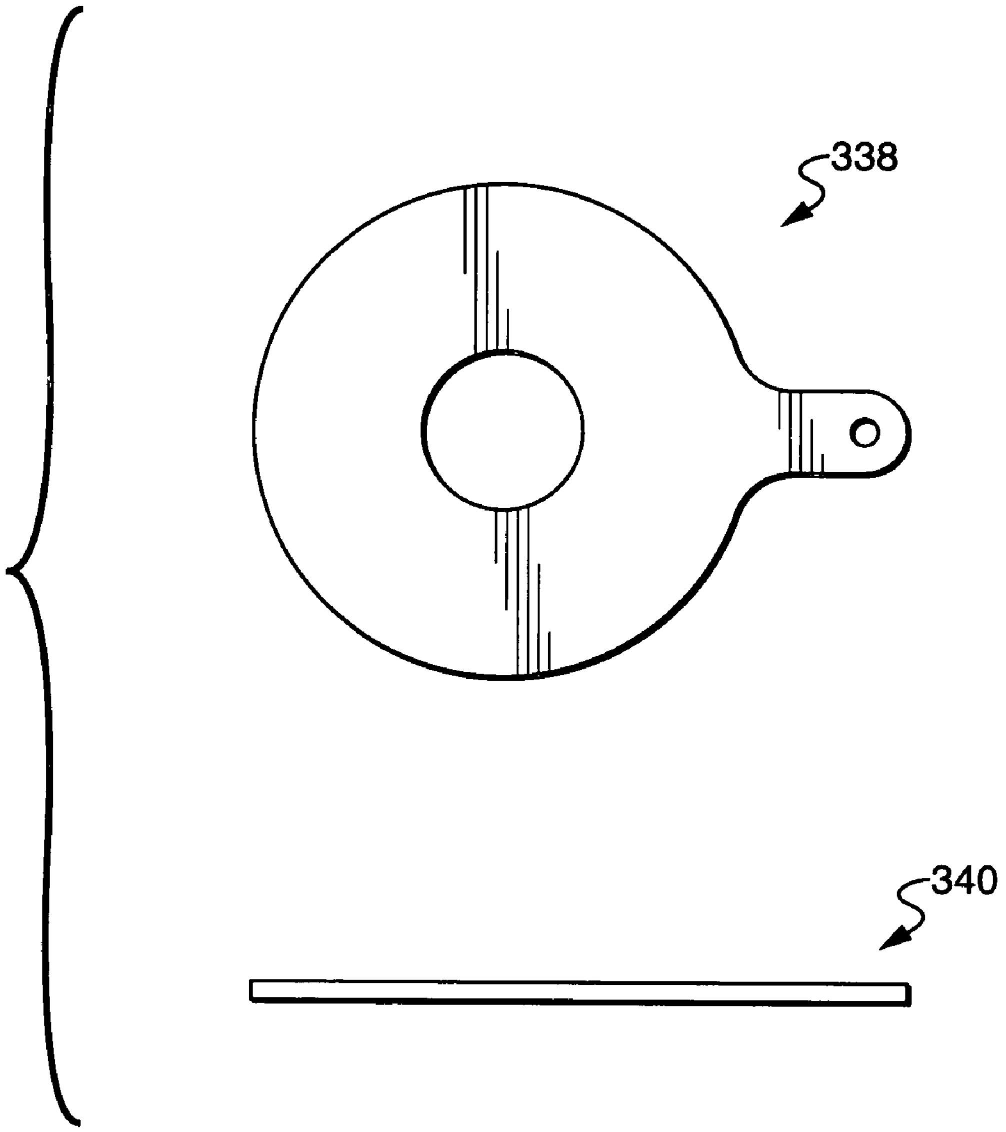
FIG. 9G shows a top view and a side view of the electrode of the transducer of FIG. 9A; and, FIG. 10 shows a manufacturers list for the constituent parts of the transducer of FIG. 9A.

FIGS. 9A through 9G are detailed drawings of one preferred embodiment of an ultrasonic transducer 100 according to the present invention. FIG. 9A shows a top view 300, an associated sectional view 302 and a constituent parts list 304 of one embodiment of the transducer 100. FIG. 9B shows a top view 306, a side view 308 and an associated sectional view 310 of one embodiment of the front mass 104. FIG. 9C shows a top view 312, a front view 314, a side view 316 and an isometric view 318 of one embodiment of the back mass 102. FIG. 9D shows a top view 320, a front view 322 and a side view 324 of one embodiment of the ceramic disc resonator (106 or 108) prior to lapping. FIG. 9E shows a front view 326, a side view 328 and an associated sectional view 330 of one embodiment of the ceramic disc resonator (106 or 108) after lapping. FIG. 9F shows a top view 332, a front view 334 and a side view 336 of one embodiment of the insulator 110. FIG. 9G shows a top view 338 and a side view 340 of one embodiment of the electrode (112 or 114). FIG. 10 shows a manufacturers list for the constituent parts of one preferred embodiment of the transducer 100.

The embodiment of the invention described in FIGS. 9A–9G and FIG. 10 operates at 40 kHz, 80 kHz, 120 kHz, 140 kHz, 170 kHz, 220 kHz, and 270 kHz, with an ultrabroad bandwidth at each of these center frequencies.

In yet another embodiment of the invention, an additional electrode 150 is included between the back mass 102 and the next adjacent resonator 106. The inclusion of the additional electrode 150 has been shown to increase the useful life of the transducer 100. Further, the additional electrode 150 is critical for the version of the transducer that includes a silvered resonator, because the silvered surface of the resonator must be physically isolated from the aluminum back mass 102.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A transducer assembly for receiving a stimulating signal and producing ultrasound therefrom at two or more frequencies, over an ultrabroad bandwidth at each frequency, comprising:

a front mass disposed about a central axis;

a back mass disposed about the central axis, laterally offset from the front mass;

one or more resonators disposed about the central axis and between the front mass and the back mass, including at least one electrical contact for receiving the stimulating signal;

wherein each of the one or more resonators is characterized by at least one non-silvered face.

2. A transducer assembly according to claim 1, wherein the back mass consists of a low-density material.

3. A transducer assembly according to claim 2, wherein the low-density material includes aluminum.

4. A transducer assembly according to claim 2, wherein the low-density material includes an aluminum alloy.

5. A transducer assembly according to claim 2, wherein the low-density material includes magnesium.

6. A transducer assembly according to claim 2, wherein the low-density material includes a magnesium alloy.

7. A transducer assembly according to claim 2, wherein the low-density material is characterized by a density of less than 6.0 g/cc.

8. A transducer assembly according to claim 2, wherein (i) the front mass includes a front bore disposed about the central axis and passing at least partially through the front mass, (ii) the back mass includes a back bore disposed about the central axis and passing through the back mass, and (iii) each of the one or more resonators includes a resonator bore disposed about the central axis and passing through the resonator.

9. A transducer assembly according to claim 8, further including a bias bolt disposed along the central axis, through the back mass, through the one or more resonators, and at least partially through the front mass, wherein the bias bolt adjustably engages the back mass and the front mass so as to compress the one or more resonators between the back mass and the front mass.

10. A transducer assembly according to claim 2, wherein all of the faces of the one or more resonators are non-silvered.

11. A transducer assembly according to claim 2, wherein the front mass is characterized by radial symmetry about the central axis.

12. A transducer assembly according to claim 2, wherein the front mass is characterized by a deviation from radial symmetry about the central axis.

13. A transducer assembly according to claim 12, wherein the deviation from radial symmetry includes lateral slots formed in the outer surface of the front mass parallel to the central axis.

14. A transducer assembly according to claim 12, wherein the deviation from radial symmetry includes an elliptical cross section of the front mass in a plane perpendicular to the central axis.

15. A transducer assembly according to claim 12, wherein the deviation from radial symmetry includes flat regions along the outer surface of the front mass parallel to the central axis.

16. A transducer assembly according to claim 2, wherein the front mass includes one or more non-supported regions near an outer face of the front mass.

17. A transducer assembly according to claim 2, wherein each of the one or more resonators is characterized by a size that produces radial resonant frequencies in the resonator coinciding with two or more resonant frequencies of the transducer assembly, so as to maximize an ultrasonic power output of the transducer assembly at the two or more resonant frequencies of the transducer assembly.

18. A transducer assembly according to claim 2, wherein each of the one or more resonators is characterized by a size that produces radial resonant frequencies in the resonator not coinciding with two or more resonant frequencies of the transducer assembly, so as to minimize strain on the transducer assembly at the two or more resonant frequencies of the transducer assembly.

19. A transducer assembly according to claim 2, further including an electrical contact disposed between the back mass and a next adjacent resonator.

20. A transducer assembly for receiving a stimulating signal and producing ultrasound therefrom at two or more frequencies, over an ultrabroad bandwidth at each frequency, comprising:

a front mass disposed about a central axis;

a back mass disposed about the central axis, laterally offset from the front mass;

one or more resonators disposed about the central axis and between the front mass and the back mass, including at least one electrical contact for receiving the stimulating signal;

wherein the front mass is characterized by a deviation from radial symmetry about the central axis.

21. A transducer assembly according to claim 20, wherein the deviation from radial symmetry includes lateral slots formed in the outer surface of the front mass parallel to the central axis.

22. A transducer assembly according to claim 20, wherein the deviation from radial symmetry includes an elliptical cross section of the front mass in a plane perpendicular to the central axis.

23. A transducer assembly according to claim 20, wherein the deviation from radial symmetry includes flat regions along the outer surface of the front mass parallel to the central axis.

24. A transducer assembly for receiving a stimulating signal and producing ultrasound therefrom at two or more frequencies, over an ultrabroad bandwidth at each frequency, comprising:

a front mass disposed about a central axis;

a back mass disposed about the central axis, laterally offset from the front mass;

one or more resonators disposed about the central axis and between the front mass and the back mass, including at least one electrical contact for receiving the stimulating signal;

wherein each of the one or more resonators is characterized by a size that produces radial resonant frequencies in the resonator coinciding with two or more resonant frequencies of the transducer assembly, so as to maximize an ultrasonic power output of the transducer assembly at the one or more resonant frequencies of the transducer assembly.

25. A transducer assembly for receiving a stimulating signal and producing ultrasound therefrom at two or more frequencies, over an ultrabroad bandwidth at each frequency, comprising:

a front mass disposed about a central axis;

a back mass disposed about the central axis, laterally offset from the front mass;

one or more resonators disposed about the central axis and between the front mass and the back mass, including at least one electrical contact for receiving the stimulating signal;

wherein the front mass includes one or more non-supported regions near an outer face of the front mass.

* * * * *